US010700079B2

(12) United States Patent
Park et al.

(10) Patent No.: US 10,700,079 B2
(45) Date of Patent: Jun. 30, 2020

(54) NONVOLATILE MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: June-hong Park, Seongnam-si (KR); Bong-soon Lim, Seoul (KR); Il-han Park, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/193,007

(22) Filed: Nov. 16, 2018

(65) Prior Publication Data

US 2019/0157284 A1 May 23, 2019

(30) Foreign Application Priority Data

Nov. 17, 2017 (KR) ........................ 10-2017-0153966

(51) Int. Cl.
*H01L 27/11556* (2017.01)
*H01L 27/06* (2006.01)
(Continued)

(52) U.S. Cl.
CPC .... *H01L 27/11556* (2013.01); *G11C 16/0483* (2013.01); *H01L 21/823481* (2013.01); *H01L 21/823487* (2013.01); *H01L 23/535* (2013.01); *H01L 27/0688* (2013.01); *H01L 27/11286* (2013.01); *H01L 27/11531* (2013.01); *H01L 27/11573* (2013.01); *H01L 27/11582* (2013.01)

(58) Field of Classification Search
CPC ............. H01L 23/535; H01L 27/11531; H01L 27/11556; H01L 27/0688; H01L 27/11386; H01L 27/11573; G11C 16/0483
See application file for complete search history.

(56) References Cited

U.S. PATENT DOCUMENTS 7,936,004 B2 * 5/2011 Kito .................... H01L 21/8221
257/324
8,335,109 B2 12/2012 Seol et al.
(Continued)

FOREIGN PATENT DOCUMENTS

KR        10-1040154 B1      6/2011
KR     10-2013-0072910 A     7/2013

*Primary Examiner* — William Coleman
(74) *Attorney, Agent, or Firm* — Lee IP Law, P.C.

(57) ABSTRACT

A nonvolatile memory device and a method of manufacturing the device, the device including a first semiconductor layer, the first semiconductor layer including an upper substrate, and a memory cell array, the memory cell array including a plurality of gate conductive layers stacked on the upper substrate and a plurality of pillars passing through the plurality of gate conductive layers and extending in a direction perpendicular to a top surface of the upper substrate; and a second semiconductor layer under the first semiconductor layer, the second semiconductor layer including a lower substrate, at least one contact plug between the lower substrate and the upper substrate, and a common source line driver on the lower substrate and configured to output a common source voltage for the plurality of pillars through the at least one contact plug.

19 Claims, 18 Drawing Sheets

(51) Int. Cl.
*H01L 23/535* (2006.01)
*H01L 21/8234* (2006.01)
*G11C 16/04* (2006.01)
*H01L 27/11582* (2017.01)
*H01L 27/11531* (2017.01)
*H01L 27/11573* (2017.01)
*H01L 27/112* (2006.01)

(56) References Cited

U.S. PATENT DOCUMENTS

| | | |
|---|---|---|
| 8,551,838 B2 * | 10/2013 | Kito .................... H01L 21/8221 |
| | | 438/257 |
| 8,730,727 B2 | 5/2014 | Yoo et al. |
| 8,811,079 B2 | 8/2014 | Fukuda et al. |
| 8,829,598 B2 | 9/2014 | Lim et al. |
| 8,897,089 B2 | 11/2014 | Kim et al. |
| 9,263,461 B2 | 2/2016 | Tanzawa |
| 9,287,286 B2 | 3/2016 | Kim et al. |
| 9,455,263 B2 | 9/2016 | Zhang et al. |
| 9,646,984 B2 | 5/2017 | Kim et al. |
| 9,653,562 B2 | 5/2017 | Kim et al. |
| 10,381,373 B2 * | 8/2019 | Okizumi ............ G11C 16/0483 |

* cited by examiner

US 10,700,079 B2

NONVOLATILE MEMORY DEVICE AND METHOD OF MANUFACTURING THE SAME

CROSS-REFERENCE TO RELATED APPLICATION

Korean Patent Application No. 10-2017-0153966, filed on Nov. 17, 2017, in the Korean Intellectual Property Office, and entitled: "Nonvolatile Memory Device and Method of Manufacturing the Same," is incorporated by reference herein in its entirety.

BACKGROUND

1. Field

Embodiments relate to a nonvolatile memory device and a method of manufacturing the same.

2. Description of the Related Art

As information communication devices have been developed to be multifunctional, memory devices may have a large capacity and a high degree of integration. As memory cell sizes decrease for the purpose of high integration, structures of operation circuits and/or wirings included in memory devices for electrical connection and operations of the memory devices have become more complex.

SUMMARY

The embodiments may be realized by providing a nonvolatile memory device including a first semiconductor layer, the first semiconductor layer including an upper substrate, and a memory cell array, the memory cell array including a plurality of gate conductive layers stacked on the upper substrate and a plurality of pillars passing through the plurality of gate conductive layers and extending in a direction perpendicular to a top surface of the upper substrate; and a second semiconductor layer under the first semiconductor layer, the second semiconductor layer including a lower substrate, at least one contact plug between the lower substrate and the upper substrate, and a common source line driver on the lower substrate and configured to output a common source voltage for the plurality of pillars through the at least one contact plug.

The embodiments may be realized by providing a method of manufacturing a nonvolatile memory device, the method including forming one or more peripheral transistors on a portion of a lower substrate; forming a lower insulating layer covering the one or more peripheral transistors; forming one or more contact plugs passing through the lower insulating layer and vertically extending from the one or more peripheral transistors; forming, on the lower insulating layer, an upper substrate that includes a metal layer electrically connected to the one or more contact plugs; and forming a memory cell array that includes a plurality of gate conductive layers stacked on the upper substrate.

The embodiments may be realized by providing a nonvolatile memory device including a first semiconductor layer, the first semiconductor layer including an upper substrate, a plurality of pillars vertically extending from the upper substrate, and a memory cell array that includes a plurality of gate conductive layers stacked on the upper substrate along side walls of the plurality of pillars; and a second semiconductor layer under the first semiconductor layer, the second semiconductor layer including a lower substrate on which a common source line driver configured to output a common source voltage to the memory cell array is formed, a lower insulating layer between the lower substrate and the upper substrate, and one or more contact plugs passing through at least a portion of the lower insulating layer and electrically connecting the common source line driver and the upper substrate.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
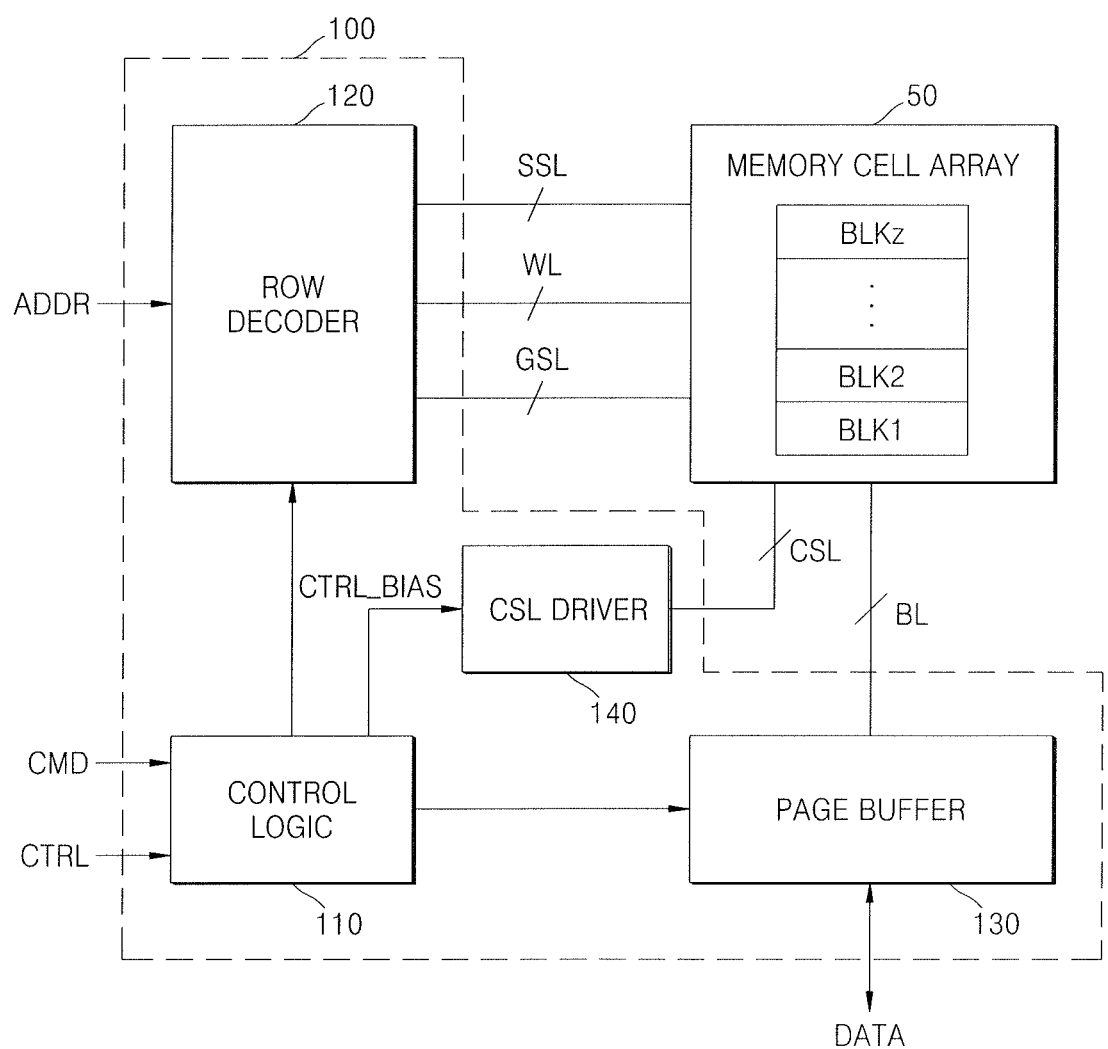
FIG. 1 illustrates a block diagram of a memory device according to an embodiment.

FIG. 1 illustrates a block diagram of a memory device 10 according to an embodiment.

Referring to FIG. 1, the memory device 10 may include a memory cell array 50 and a peripheral circuit 100. In an implementation, the memory device 10 may further include a data input/output circuit or an input/output interface.

The memory cell array 50 may include a plurality of memory cells, and may be connected to string selection lines SSL, word lines WL, ground selection lines GSL, common source lines CSL, and bit lines BL. For example, the memory cell array 50 may be connected to a row decoder 120 through the string selection lines SSL, the word lines WL, and the ground selection lines GSL, and may be connected to a page buffer 130 through the bit lines BL. Also, the memory cell array 50 may be connected to a common source line driver 140 through the common source lines CSL.

For example, the plurality of memory cells included in the memory cell array 50 may be nonvolatile memory cells that retain data even when power is turned off. For example, when the memory cells are nonvolatile memory cells, the memory device 10 may be an electrically erasable programmable read-only memory (EEPROM), a flash memory, a phase-change random-access memory (PRAM), a resistive random-access memory (RRAM), a nano-floating gate memory (NFGM), a polymer random-access memory (PoRAM), a magnetic random-access memory (MRAM) or a ferroelectric random-access memory (FRAM). In an implementation, the plurality of memory cells may be, e.g., NAND flash memory cells.

The memory cell array 50 may include a plurality of memory blocks, e.g., first through zth memory blocks BLK1 through BLKz, and each memory block may have a planar structure or a three-dimensional (3D) structure. The memory cell array 50 may include at least one from among a single-level cell block including single-level cells (SLC), a multi-level cell block including multi-level cells (MLC), a triple-level cell block including triple-level cells (TLC), and a quad-level cell block including quad-level cells (QLC). For example, some memory blocks from among the first through zth memory blocks BLK1 through BLKz may be single-level cell blocks, and other memory blocks may be multi-level cell blocks, triple-level cell blocks, or quad-level cell blocks.

The peripheral circuit 100 may receive an address ADDR, a command CMD, and a control signal CTRL from the outside of the memory device 10, and may transmit/receive data DATA to/from an external device of the memory device 10. The peripheral circuit 100 may include a control logic 110, the row decoder 120, the page buffer 130, and the common source line driver 140. In an implementation, the peripheral circuit 100 may further include various sub-circuits such as a voltage generating circuit for generating various voltages needed to operate the memory device 10 and an error correction circuit for correcting an error of data read from the memory cell array 50.

The control logic 110 may control an overall operation of the memory device 10. For example, the control logic 110 may control the memory device 10 to perform a memory operation corresponding to the command CMD applied from a memory controller. The control logic 110 may generate various internal control signals used in the memory device 10 in response to the control signal CTRL applied from the memory controller. For example, the control logic 110 may adjust levels of voltages applied to the word lines WL, the bit lines BL, and the common source lines CSL during a memory operation such as a program operation or an erase operation.

The row decoder 120 may select at least one from among the first through zth memory blocks BLK1 through BLKz in response to the address ADDR applied from the memory controller. The row decoder 120 may select at least one from among word lines of the selected memory block in response to the address ADDR.

The row decoder 120 may apply a voltage for performing a memory operation to the selected word line of the selected memory block. For example, during a program operation, the row decoder 120 may apply a program voltage and a verify voltage to the selected word line, and may apply a pass voltage to non-selected word lines. Also, the row decoder 120 may select some string selection lines from among the string selection lines SSL in response to the address ADDR.

The page buffer 130 may be connected to the memory cell array 50 through the bit lines BL. The page buffer 130 may operate as a write driver or a sense amplifier. In detail, during a program operation, the page buffer 130 may operate as a write driver and may apply a voltage according to the data DATA to be stored in the memory cell array 50 to the bit lines BL. During a read operation, the page buffer 130 may operate as a sense amplifier and may sense the data DATA stored in the memory cell array 50.

The common source line driver 140 may be connected to the memory cell array 50 through the common source lines CSL. The common source line driver 140 may apply a common source voltage to the common source lines CSL under the control of the control logic 110.

In an implementation, the common source line driver 140 may be located under the memory cell array 50 to overlap at least a part of the memory cell array 50. Also, the common source line driver 140 may apply a common source voltage to an upper substrate that supports the memory cell array 50, through a contact plug located under the memory cell array 50, which will be described below in detail.

Figure 2:
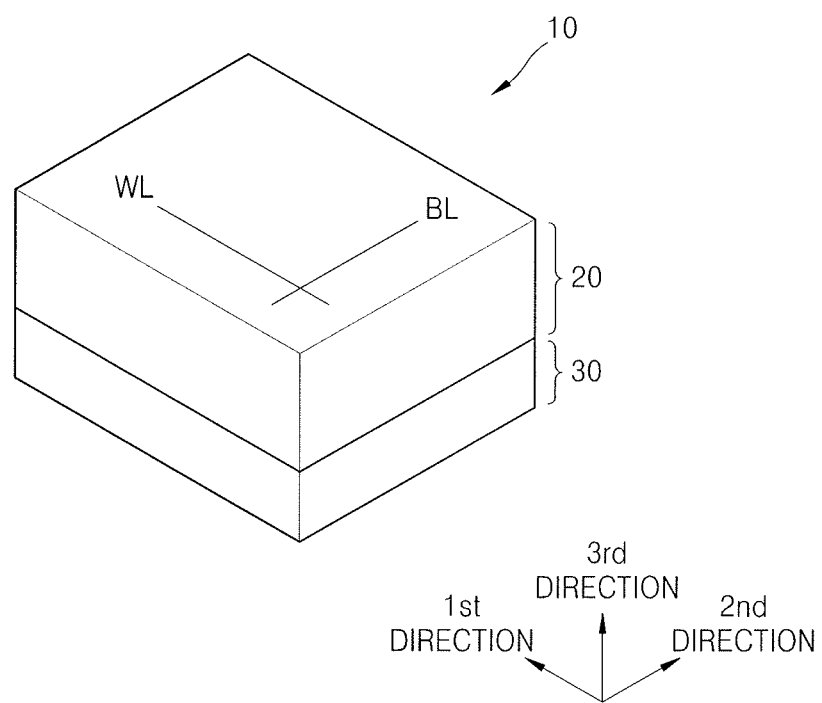
FIG. 2 illustrates a perspective view of a structure of the memory device of FIG. 1, according to an embodiment.

FIG. 2 illustrates a perspective view of a structure of the memory device 10 of FIG. 1 according to an embodiment. As described with reference to FIG. 1, the memory device 10 may include the memory cell array 50 and the peripheral circuit 100, and elements of the memory device 10 may be formed by using a semiconductor manufacturing process. FIG. 2 will be described with reference to FIG. 1.

Referring to FIG. 2, the memory device 10 may include a first semiconductor layer 20 and a second semiconductor layer 30. The first semiconductor layer 20 may be stacked on the second semiconductor layer 30 in a third direction. In an implementation, the memory cell array 50 of FIG. 1 may be formed on the first semiconductor layer 20, and the peripheral circuit 100 including the common source line driver 140 may be formed on the second semiconductor layer 30. For example, the second semiconductor layer 30 may include a lower substrate, and circuits, e.g., circuits corresponding to the control logic 110, the row decoder 120, the page buffer 130, and the common source line driver 140, may be formed on the second semiconductor layer 30 by forming semiconductor elements such as transistors and patterns for wiring the semiconductor elements on the lower substrate.

After the circuits are formed on the second semiconductor layer 30, the first semiconductor layer 20 including the memory cell array 50 may be formed. For example, the first semiconductor layer 20 may include an upper substrate, and the memory cell array 50 may be formed on the first semiconductor layer 20 by forming a plurality of gate conductive layers stacked on the upper substrate and a plurality of pillars passing through the plurality of gate conductive layers and extending in a direction (e.g., the third direction) perpendicular to a top surface of the upper substrate. Also, patterns for electrically connecting the circuits formed on the second semiconductor layer 30 and the memory cell array 50 (i.e., the word lines WL and the bit lines BL) may be formed. For example, the word lines WL may extend in a first direction and may be arranged (e.g., periodically) in a second direction. Also, the bit lines BL may extend in the second direction and may be arranged (e.g., periodically) in the first direction.

Accordingly, the memory device 10 may have a structure in which the memory cell array 50 and the peripheral circuit 100 are located in a stacked direction (e.g., the third direction). that is, a cell-on-peri or cell-over-peri (COP) structure. Circuits other than the memory cell array 50 may be located under the memory cell array 50, the COP structure may effectively reduce an area on a surface perpendicular to the stacked direction, and thus the number of memory cells integrated in the memory device 10 may be increased.

In an implementation, a plurality of pads for electrical connection to the outside of the memory device 10 may be provided. For example, a plurality of pads for the command CMD, the address ADDR, and the control signal CTRL received from an external device of the memory device 10 may be provided, and a plurality of pads for inputting/outputting the data DATA may be provided. The pads may be located adjacent to the peripheral circuit 100, which processes a signal transmitted to the outside of the memory device 10 or a signal received from the outside of the memory device 10, in a vertical direction (e.g., the third direction) or a horizontal direction (e.g., the first direction or the second direction).

Figure 3:
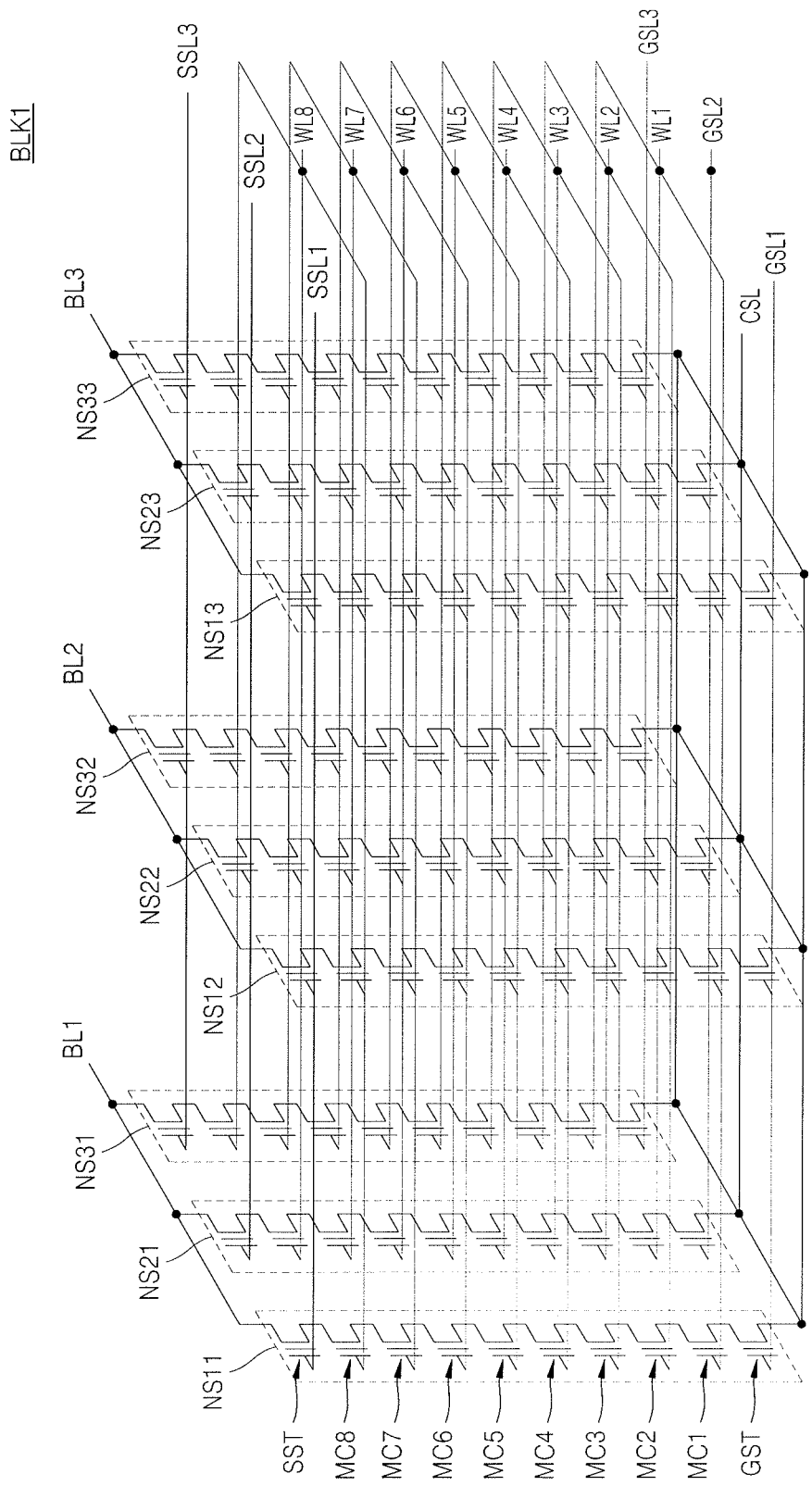
FIG. 3 illustrates a circuit diagram of an equivalent circuit of a first memory block from among memory blocks of FIG. 1, according to an embodiment.

FIG. 3 illustrates a circuit diagram of an equivalent circuit of the first memory block BLK1 from among the first through zth memory blocks BLK1 through BLKz of FIG. 1 according to an embodiment.

Referring to FIG. 3, the first memory block BLK1 may be a vertical NAND flash memory, and each of the first through zth memory blocks BLK1 through BLKz of FIG. 1 may be implemented as shown in FIG. 3. The first memory block BLK1 may include a plurality of NAND strings NS11 through NS33, a plurality of word lines, e.g., first through eighth word lines WL1 through WL8, a plurality of bit lines, e.g., first through third bit lines BL1 through BL3, a plurality of ground selection lines, e.g., first through third ground selection lines GSL1 through GSL3, a plurality of string selection lines, e.g., first through third string selection lines SSL1 through SSL3, and the common source line CSL. The number of NAND strings, the number of word lines, the number of bit lines, the number of ground selection lines, and the number of string selection lines may be changed in various ways according to embodiments.

The NAND strings NS11, NS21, and NS31 may be provided between the first bit line BL1 and the common source line CSL, the NAND strings NS12, NS22, and NS32 may be provided between the second bit line BL2 and the common source line CSL, and the NAND strings NS13, NS23, and NS33 are provided between the third bit line BL3 and the common source line CSL. Each NAND string (e.g., NS11) may include a string selection transistor SST, a plurality of memory cells MC1 through MC8, and a ground selection transistor GST.

NAND strings commonly connected to one bit line may constitute one column.

For example, the NAND strings NS11, NS21, and NS31 commonly connected to the first bit line BL1 may correspond to a first column, the NAND strings NS12, NS22, and NS32 commonly connected to the second bit line BL2 may correspond to a second column, and the NAND strings NS13, NS23, and NS33 commonly connected to the third hit line BL3 may correspond to a third column.

NAND strings connected to one string selection line may constitute one row. For example, the NAND strings NS11, NS12, and NS13 connected to the first string selection line SS1 may correspond to a first row, the NAND strings NS21, NS22, and NS23 connected to the second string selection line SSL2 may correspond to a second row, and the NAND strings NS31, NS32, and NS33 connected to the third string selection line SSL3 may correspond to a third row.

The string selection transistors SST may be connected to the first through third string selection lines SSL1 through SSL3. The plurality of memory cells MC1 through MC8 may be respectively connected to the first through eighth word lines WL1 through WL8. The ground selection transistors GST may be connected to the first through third ground selection lines GSL1 through GSL3, and the string selection transistors SST may be connected to the first through third bit lines BL1 through BL3. The ground selection transistors GST may be connected to the common source line CSL.

In an implementation, word lines at the same height (e.g., WL1) may be commonly connected, the first through third string selection lines SSL1 through SSL3 may be separated from one another, and the first through third ground selection lines GSL1 through GSL3 may be separated from one another. For example, when memory cells connected to the first word line WL1 and included in the NAND strings NS11, NS12, and NS13 corresponding to the first column are programmed, the first word line WL1 and the first string selection line SS1 are selected. In an implementation, the first through third ground selection lines GSL1 through GSL3 may be commonly connected.

Figure 4A:
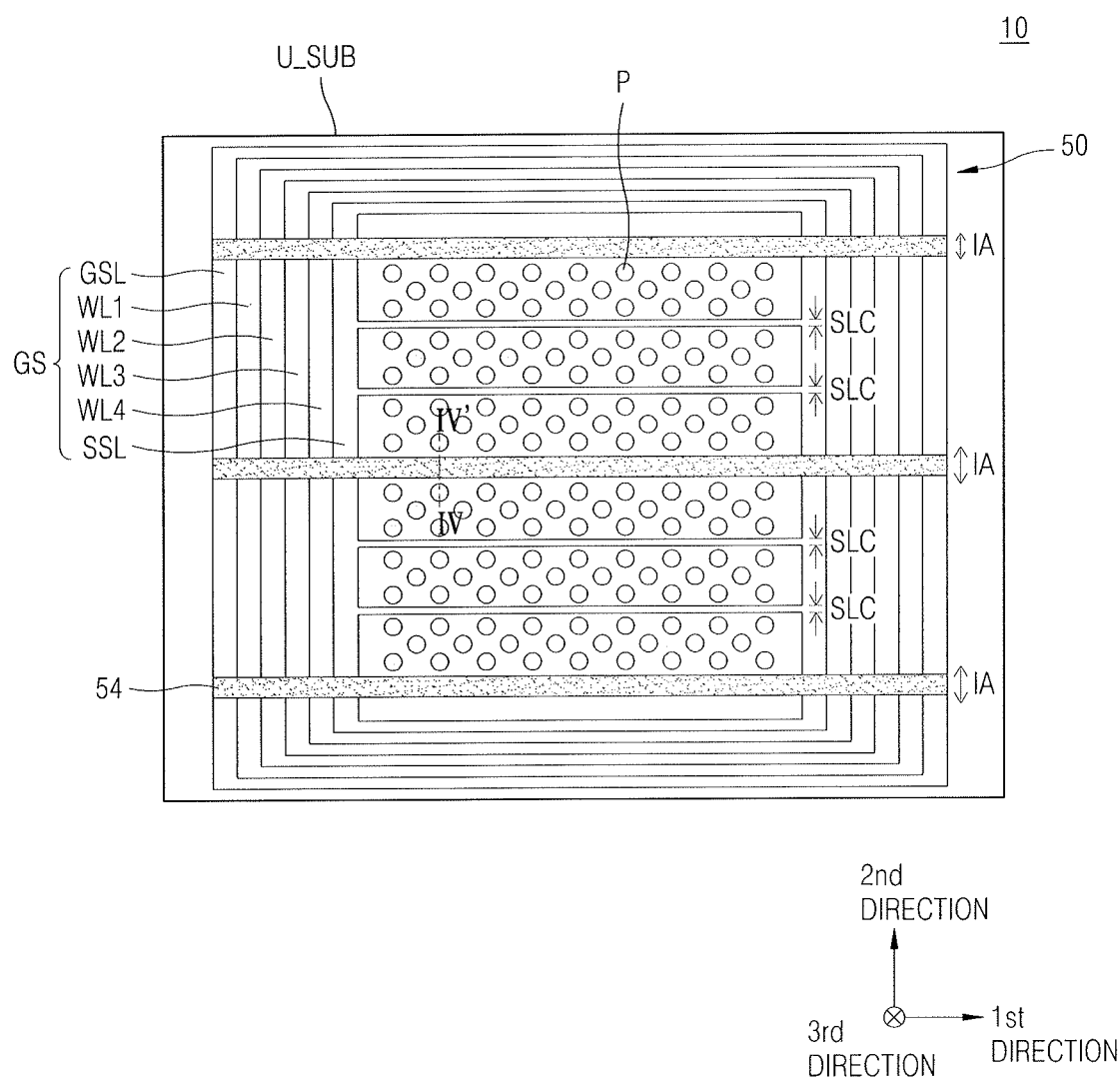
FIGS. 4A and 4B illustrate views of a memory device according to an embodiment.
Figure 4B:
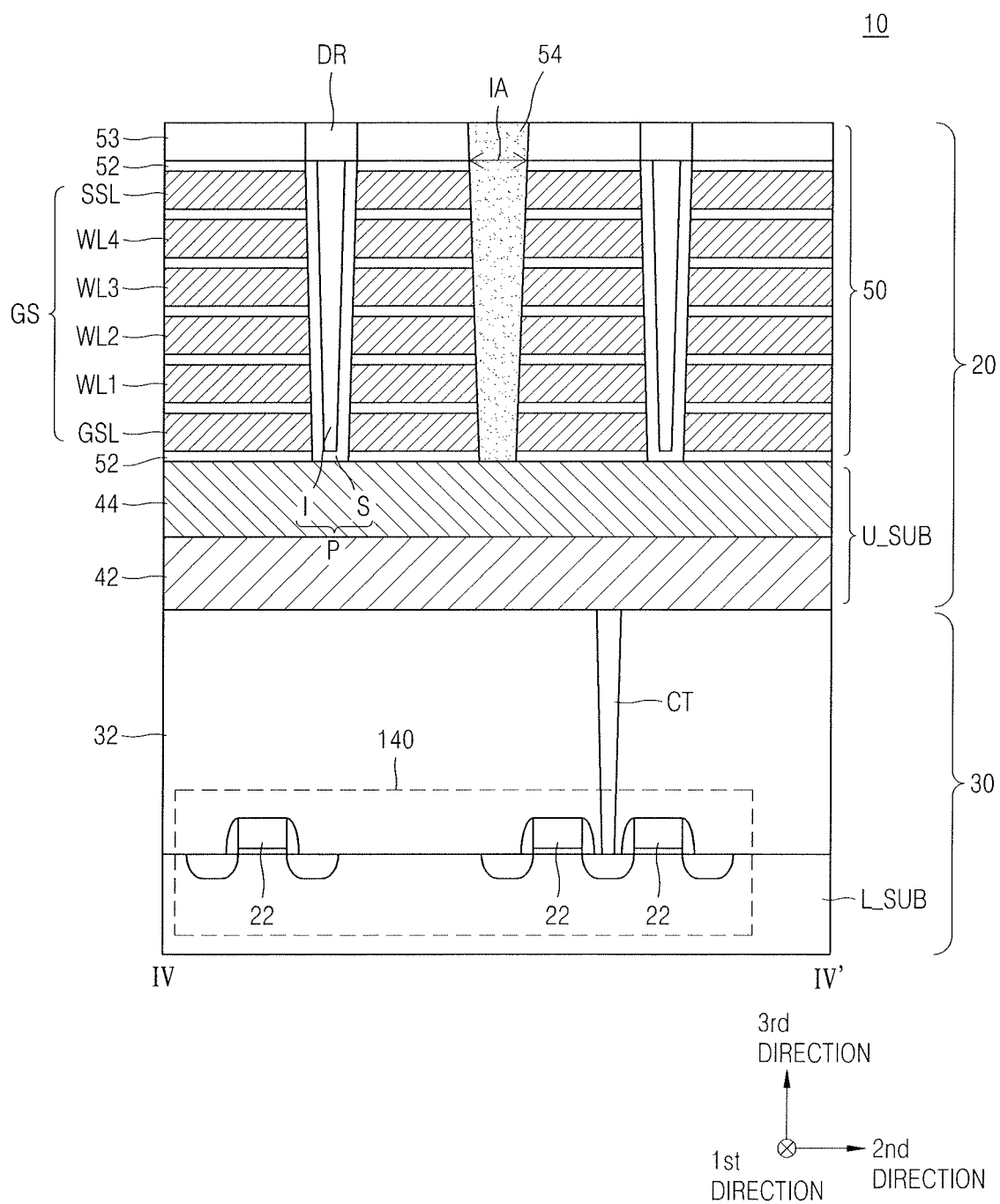

FIGS. 4A and 4B illustrate views of a memory device according to an embodiment. For example, FIG. 4A illustrates a layout of the memory device according to an embodiment. FIG. 4B illustrates a cross-sectional view taken along line IV-IV' of the memory device of FIG. 4A. For example, FIGS. 4A and 4B illustrates views of the memory device 10 of FIG. 1 according to an embodiment.

Referring to FIGS. 4A and 4B, the memory device 10 may include the first semiconductor layer 20 including the memory cell array 50 and the second semiconductor layer 30 including a peripheral transistor 22. The memory device 10 may have a structure in which the first semiconductor layer 20 is stacked on the second semiconductor layer 30.

The first semiconductor layer 20 may include an upper substrate U_SUB and the memory cell array 50 located on the upper substrate U_SUB. In an implementation, the first semiconductor layer 20 may further include upper wirings that are electrically connected to the memory cell array 50 and an upper insulating layer that covers the memory cell array 50 and the upper substrate U_SUB.

The upper substrate U_SUB may be located between the second semiconductor layer 30 and the memory cell array 50. The upper substrate U_SUB may be a support layer that supports the memory cell array 50. The upper substrate U_SUB may be referred to as, e.g., a base substrate.

The upper substrate U_SUB may include a plurality of layers. In an implementation, the upper substrate U_SUB may be stacked on the second semiconductor layer 30, and may include a metal layer 42 connected to a contact plug CT. The metal layer 42 may include, e.g., tungsten (W) or a W compound. For example, when the upper substrate U_SUB includes the metal layer 42 and the common source line driver 140 applies a common source voltage through the contact plug CT, the resistance of a path through which the common source voltage is transferred may be reduced.

In an implementation, the upper substrate U_SUB may include a doping layer 44 stacked on the metal layer 42. For example, the doping layer 44 may be a polysilicon film doped with an impurity of a first conductivity type (e.g., an n-type). The doping layer 44 may be a bulk silicon substrate, a silicon-on-insulator (SOI) substrate, a germanium substrate, a germanium-on-insulator (GOI) substrate, a silicon-germanium substrate, or a substrate of an epitaxial thin film obtained by performing selective epitaxial growth (SEG). The doping layer 44 may include a semiconductor material. For example, the doping layer 44 may include silicon (Si), germanium (Ge), silicon germanium (SiGe), gallium arsenide (GaAs), indium gallium arsenide (InGaAs), aluminum gallium arsenide (AlGaAs), or a combination thereof.

In an implementation, a common source voltage output from the common source line driver 140 may be applied to the metal layer 42 and the doping layer 44. For example, the contact plug CT, the metal layer 42, and the doping layer 44 may form a path through which a common source voltage is transferred to the memory cell array 50.

The memory cell array 50 may include gate conductive layers GS that are stacked in the third direction on the upper substrate U_SUB. The gate conductive layers GS may include the ground selection line GSL, the first through fourth word lines WL1 through WL4, and the string selection line SSL. The gate conductive layers GS may include, e.g., tungsten, tantalum, cobalt, nickel, tungsten silicide, tantalum silicide, cobalt silicide, or nickel silicide. In an implementation, the gate conductive layers GS may include polysilicon.

The ground selection line GSL, the first through fourth word lines WL1 through WL4, and the string selection line SSL may be sequentially formed on the upper substrate U_SUB, and an insulating layer 52 may be located under or over each of the gate conductive layers GS. An area (e.g., in plan view) of the gate conductive layers GS may decrease away from the upper substrate U_SUB.

In an implementation, four word lines may be formed. In an implementation, a various number of word lines may be vertically stacked on the upper substrate U_SUB to be located between the ground selection line GSL and the string selection line SSL and the insulating layers 52 may be located between adjacent word lines. Also, two or more ground selection lines GSL and two or more string selection lines SSL may be vertically stacked.

The memory cell array 50 may be isolated by an isolation insulating region IA. Also, the string selection line SSL from among the gate conductive layers GS may be isolated by a selected line cut region SLC. In an implementation, the isolation insulating region IA may be gap-filled with at least one insulating material 54. For example, the at least one insulating material 54 may include silicon oxide, silicon nitride, or silicon oxynitride.

In an implementation, the insulating material 54 may be filled in the entire isolation insulating region IA, as illustrated in FIG. 4B. In an implementation, only a part of the isolation insulating region IA may be filled with the insulating material 54.

As the isolation insulating region IA is gap-filled with the insulating material 54, plugs for electrically connecting an upper wiring of the memory cell array 50 and the upper substrate U_SUB may not be formed in the isolation insulating region IA. For example, a common source plug for connecting a common source line and the upper substrate U_SUB may not be formed in the isolation insulating region IA. Accordingly, the isolation insulating region IA may have a reduced width in a second direction.

The memory cell array 50 may include a plurality of pillars P passing through the gate conductive layers GS and the insulating layers 52 in the third direction. For example, the plurality of pillars P may pass through the gate conductive layers GS and the insulating layers 52 and may contact the doping layer 44. The plurality of pillars P may be arranged between the isolation insulating regions IA to be spaced apart from one another.

For example, a surface layer S of each of the pillars P may include a silicon material doped with an impurity, or may include a silicon material not doped with an impurity. The surface layer S may function as, e.g., a channel region. The surface layer S may be formed to have a cup shape (or a cylindrical shape with a closed bottom) that extends in the third direction. An inside I of each pillar P may include an insulating material such as silicon oxide or an air gap.

For example, the ground selection line GSL and a portion of the surface layer S adjacent to the ground selection line GSL may constitute the ground selection transistor GST (see FIG. 3). Also, the first through fourth word lines WL1 through WL4 and a portion of the surface layer S adjacent to the first through fourth word lines WL1 through WL4 may constitute the memory cell transistors MC1 through MC8 (see FIG. 3). Also, the string selection line SSL and a portion of the surface layer S adjacent to the string selection line SSL may constitute the string selection transistor SST (see FIG. 3).

A drain region DR may be formed on the pillar P. For example, the drain region DR may include a silicon material doped with an impurity. The drain region DR may be referred to as a channel pad. In an implementation, the drain region DR may be electrically connected to the bit line BL through at least one contact.

An etch-stop film 53 may be formed on a side wall of the drain region DR. A top surface of the etch-stop film 53 may be formed at a same level as that of a top surface of the drain region DR. The etch-stop film 53 may include an insulating material such as silicon nitride or silicon oxide.

The second semiconductor layer 30 may include a lower substrate L_SUB, at least one peripheral transistor 22 on the lower substrate L_SUB, a lower insulating layer 32 covering the at least one peripheral transistor 22, and the contact plug CT passing through the lower insulating layer 32. For example, the peripheral transistor 22 may be a transistor of the peripheral circuit 100 such as the control logic 110, the row decoder 120, the page buffer 130, or the common source line driver 140. The following will be described, for convenience of explanation, on the assumption that the peripheral transistor 22 is a transistor for forming the common source line driver 140.

For example, the lower substrate L_SUB may be a semiconductor substrate including a semiconductor material such as single-crystal silicon or single-crystal germanium, and may be manufactured from a silicon wafer. The common source line driver 140 including the peripheral transistor 22 may be located on the lower substrate L_SUB.

The contact plug CT may pass through the lower insulating layer 32 in the third direction, and may electrically connect the common source line driver 140 and the upper substrate U_SUB. For example, one side of the contact plug CT may contact the common source line driver 140, and the other side of the contact plug CT may contact the upper substrate U_SUB. For example, the contact plug CT may include tungsten (W), aluminum (Al), or copper (Cu). In an implementation, the contact plug CT may include polysilicon.

In an implementation, the common source line driver 140 may apply a common source voltage for the pillars P to the upper substrate U_SUB through the contact plug CT. For example, the memory device 10 may receive a common source voltage through the upper substrate U_SUB and the contact plug CT located under the memory cell array 50, instead of receiving a common source voltage through a common source plug passing through the memory cell array 50.

Accordingly, a memory device according to an embodiment may include an isolation insulating region with a reduced width, and a size of a memory cell array may be reduced and thus a chip size may also be reduced. Also, various defects caused by a common source plug formed in the isolation insulating region may be avoided, and a degree of freedom of wiring over the memory cell array may be increased.

Figure 5:
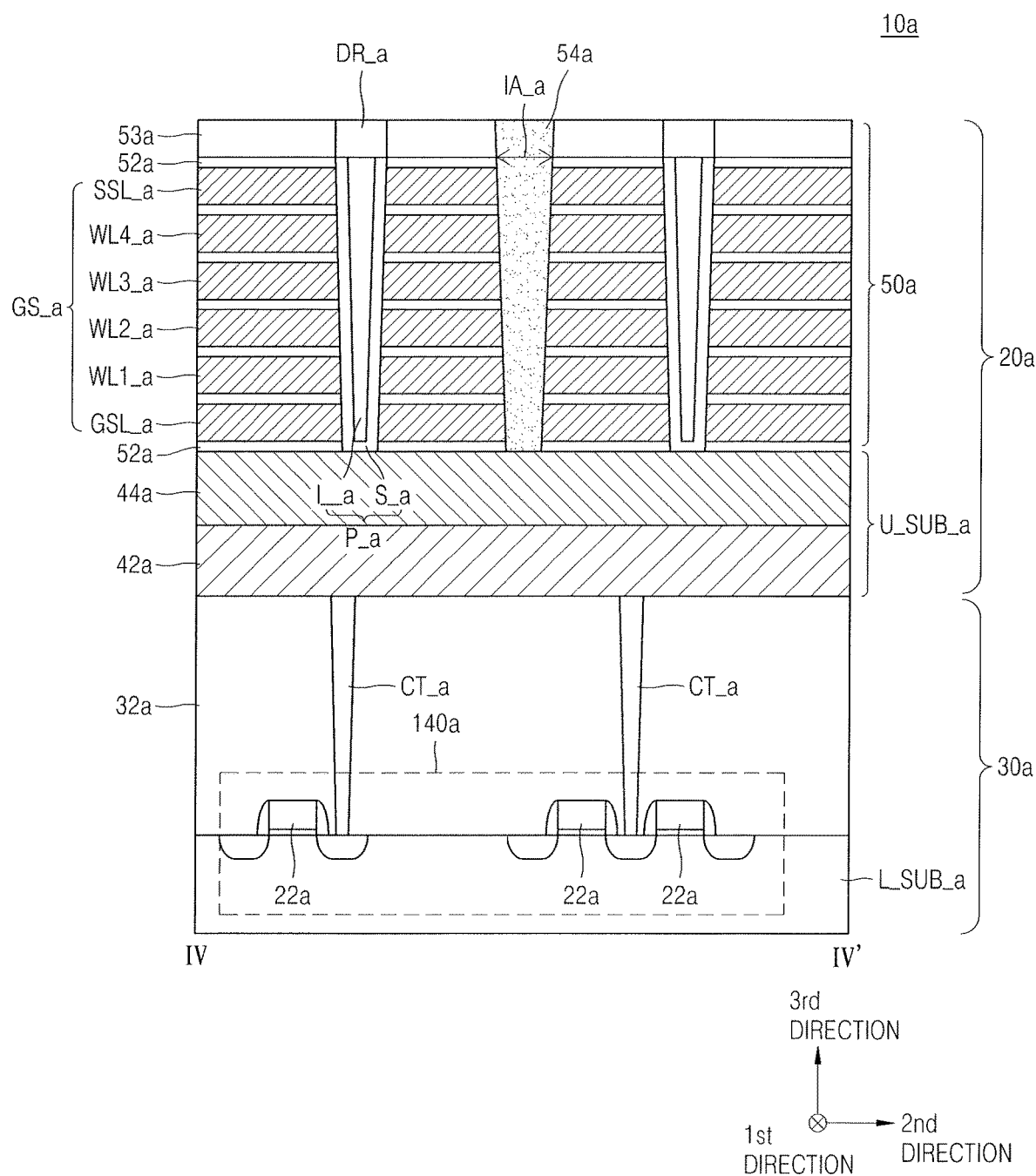
FIG. 5 illustrates a cross-sectional view of a memory device according to an embodiment.

FIG. 5 illustrates a cross-sectional view of a memory device according to an embodiment. For example, FIG. 5 illustrates a cross-sectional view taken along line IV-IV' of FIG. 4A according to another embodiment. A repeated explanation of the same elements as those in FIGS. 4A and 4B may be omitted.

Referring to FIG. 5, a common source line driver 140a may apply a common source voltage for pillars P a to an upper substrate U_SUB_a through a plurality of contact plugs CT_a that are connected to the upper substrate U_SUB_a and a common source line driver 140 in parallel. For example, the common source line driver 140a may include a plurality of outputs that output a common source voltage, and the outputs may output a common source voltage to the upper substrate U_SUB_a through the contact plugs CT_a respectively connected to the outputs. Accordingly, a common source voltage may be applied to the upper substrate U_SUB_a less sensitively to a distance from the common source line driver 140a.

Figure 6:
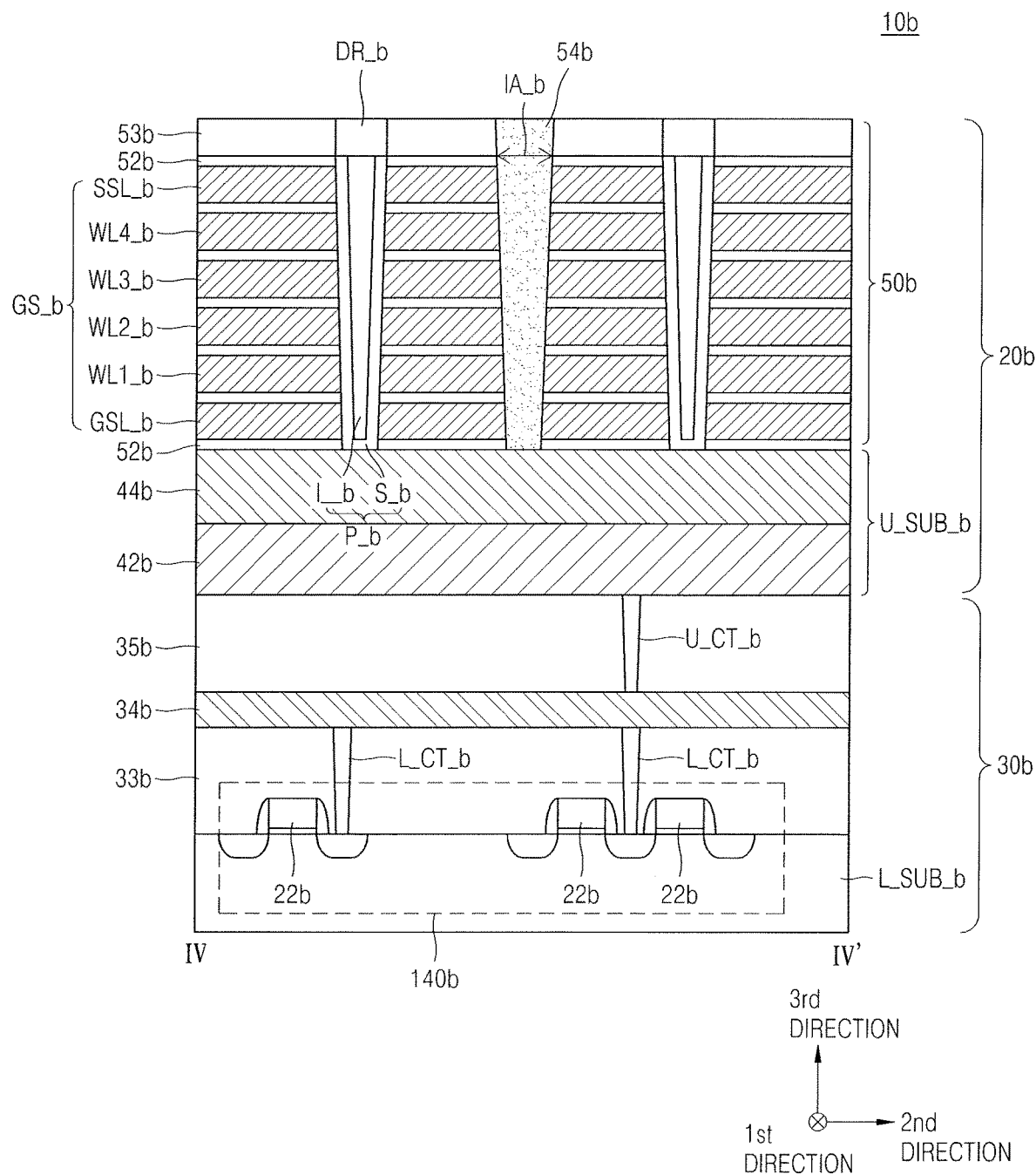
FIG. 6 illustrates a cross-sectional view of a memory device according to an embodiment.

FIG. 6 illustrates a cross-sectional view of a memory device according to an embodiment. For example, FIG. 6 illustrates a cross-sectional view taken along line IV-IV' of FIG. 4A according to another embodiment. A repeated explanation of the same elements as those in FIGS. 4A and 4B may be omitted.

Referring to FIG. 6, a second semiconductor layer 30b may include a lower substrate L_SUB_b on which a peripheral transistor 22b is formed, a first lower insulating layer 33b stacked on the lower substrate L_SUB_b, a conductive layer 34b stacked on the first lower insulating layer 33b, and a second lower insulating layer 35b stacked on the conductive layer 34b. Also, the second semiconductor layer 30b may include a lower contact plug L_CT_b that passes through the first lower insulating layer 33b in a third direction and electrically connects the conductive layer 34b and a common source line driver 140b, and an upper contact plug U_CT_b that passes through the second lower insulating layer 35b in the third direction and electrically connects the conductive layer 34b and an upper substrate U_SUB_b.

In an implementation, a number of the lower contact plugs L_CT_b in the second semiconductor layer 30b may be greater than the number of the upper contact plugs U_CT_b in the second semiconductor layer 30b. For example, the common source line driver 140b may be connected to the conductive layer 34b through a first number of lower contact plugs L_CT_b, the conductive layer 34b may be connected to the upper substrate U_SUB_b through a second number of upper contact plugs U_CT_b, and the second number may be less than the first number.

Figure 7:
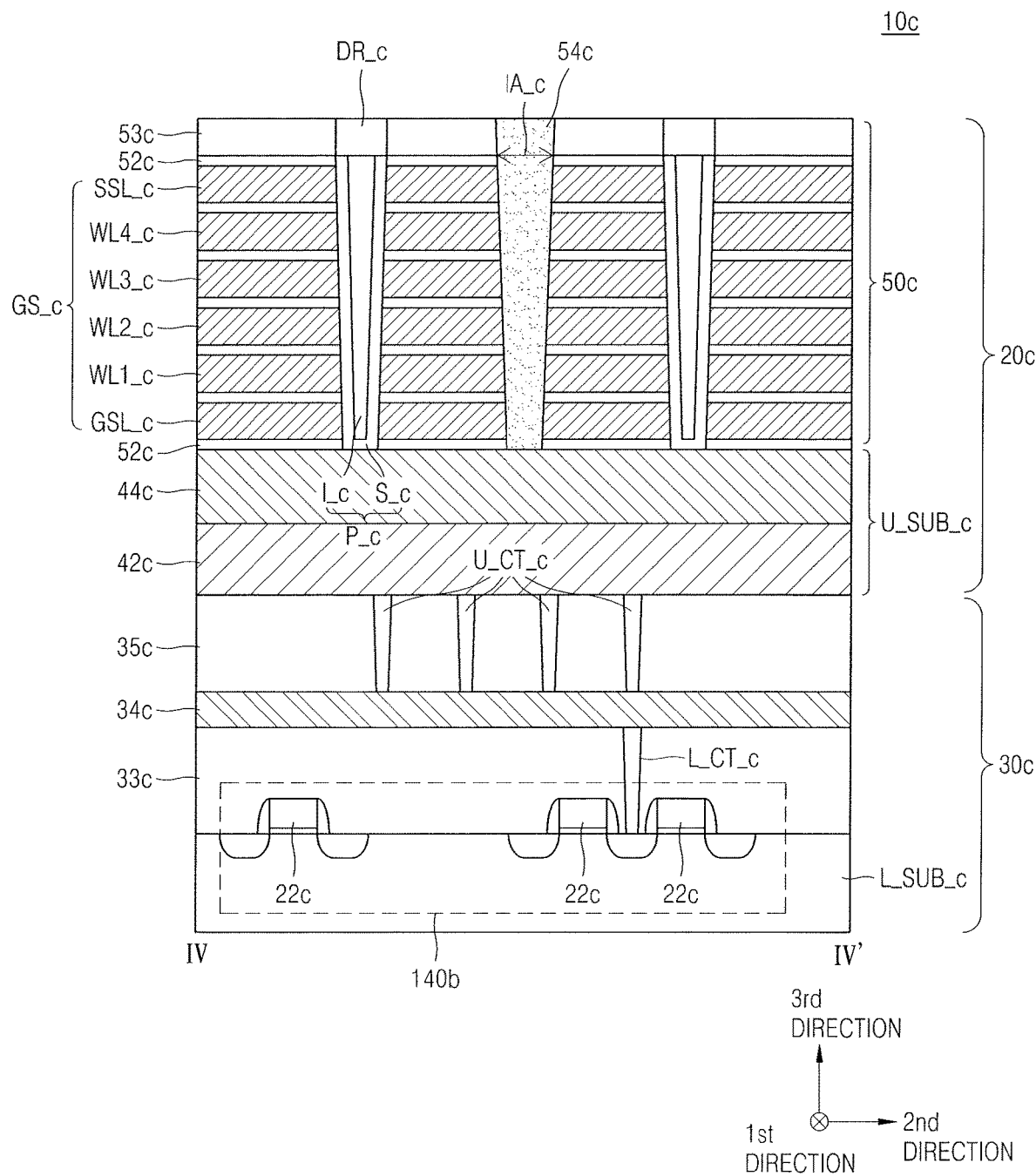
FIG. 7 illustrates a cross-sectional view of a memory device according to an embodiment.

FIG. 7 illustrates a cross-sectional view of a memory device according to an embodiment. For example, FIG. 7 illustrates a cross-sectional view taken along line IV-IV' of FIG. 4A according to another embodiment.

A configuration of a memory device 10c of FIG. 7 is similar to a configuration of a memory device 10b of FIG. 6. However, in the present embodiment, the number of lower contact plugs L_CT_c in the second semiconductor layer 30c may be less than the number of upper contact plugs U_CT_c in the second semiconductor layer 30c. For example, a common source line driver 140c may be connected to a conductive layer 34c through a third number of lower contact plugs L_CT_c, the conductive layer 34c may be connected to an upper substrate U_SUB_c through a fourth number of upper contact plugs U_CT_c, and the fourth number may be greater than the third number.

Figure 8A:
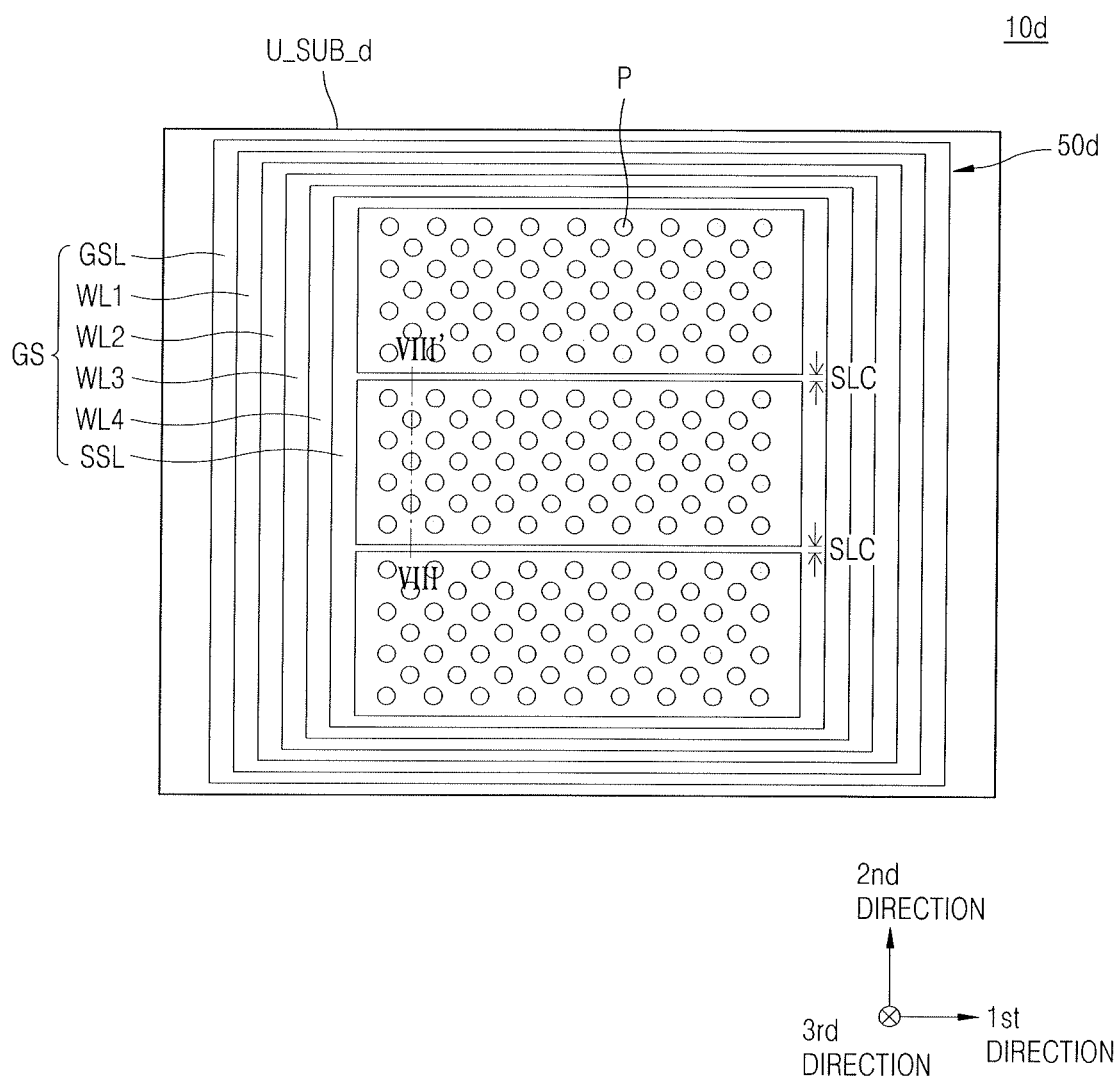
FIGS. 8A and 8B illustrate views of a memory device according to an embodiment.
Figure 8B:
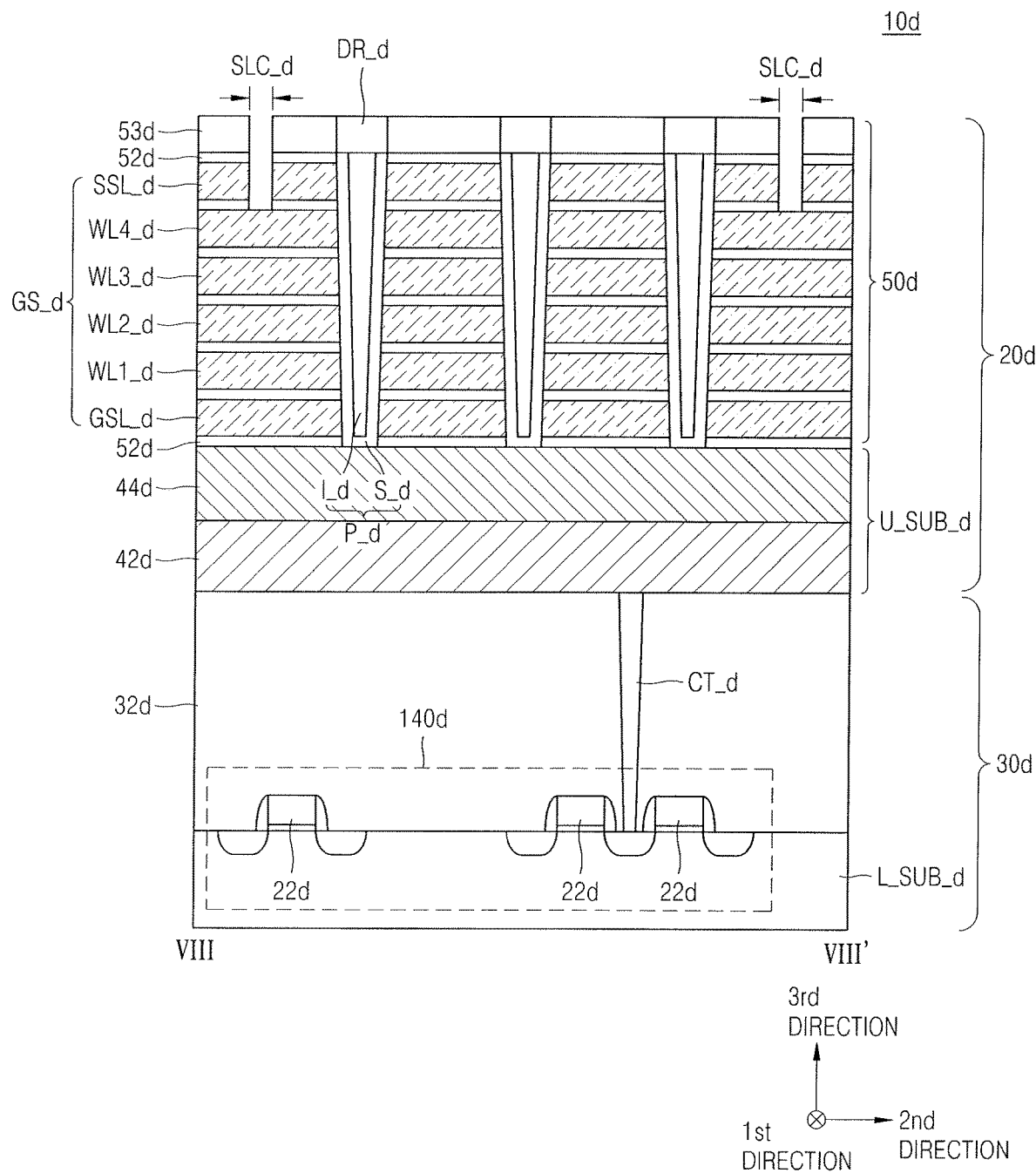

FIGS. 8A and 8B illustrate a memory device according to an embodiment. In detail, FIG. 8A illustrates a layout of the memory device according to an embodiment. FIG. 8B illustrates a cross-sectional view taken along line VIII-VIII' of FIG. 8A.

A configuration of a memory device 10d of FIGS. 8A and 8B is similar to a configuration of the memory device 10 of FIGS. 4A and 4B. However, in the present embodiment, the isolation insulating region IA of FIGS. 4A and 4B may not be formed in a memory cell array 50d. In an embodiment, the memory device 10d may be formed by omitting a process of replacing a preliminary gate layer with a gate conductive layer. For example, the gate conductive layers GS may include polysilicon.

FIGS. 9A through 9H illustrate views of stages in a method of manufacturing a memory device according to a process order according to an embodiment. The method of the present embodiment may be a method of manufacturing, e.g., the memory device 10 of FIG. 4A.

Figure 9A:
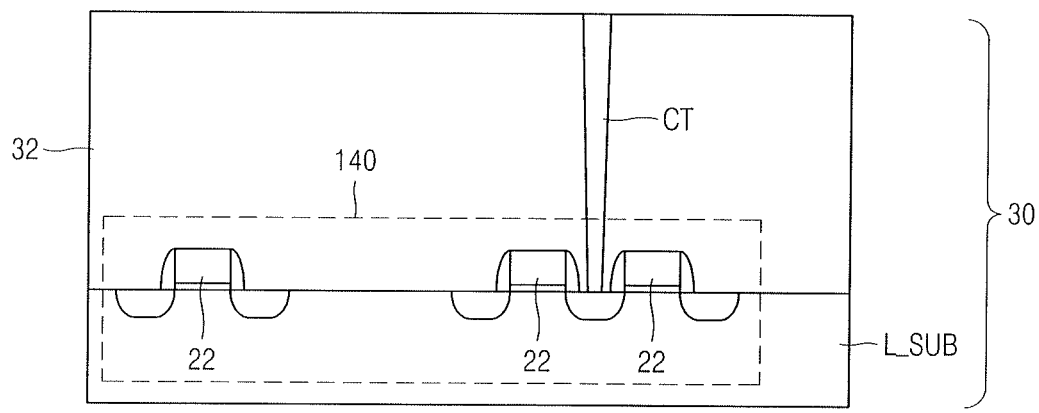
FIGS. 9A through 9H illustrate views of stages in a method of manufacturing a memory device according to a process order, according to an embodiment.

Referring to FIG. 9A, the common source line driver 140 may be formed on a portion of the lower substrate L_SUB. The common source line driver 140 may include, e.g., a plurality of the peripheral transistors 22. In an implementation, a p-type well for peripheral circuits and/or an n-type well for peripheral circuits may be formed in the lower substrate L_SUB by using a plurality of ion implantation processes. For example, the p-type well for peripheral circuits may be an NMOS transistor forming region, and the n-type well for peripheral circuits may be a PMOS transistor forming region.

After the common source line driver 140 is formed, the contact plug CT and the lower insulating layer 32 may be formed. For example, the lower insulating layer 32 that covers the peripheral transistors 22 may be formed on the lower substrate L_SUB, a trench may be formed in the lower substrate L_SUB, and then the contact plug CT may be formed by gap-filling the trench with a conductive material. Accordingly, the contact plug CT that passes through the lower insulating layer 32 and has one side connected to the common source line driver 140 may be formed.

In an implementation, the lower insulating layer 32 may further include a plurality of interlayer insulating films, and one or more etch-stop films. The second semiconductor layer 30 may be formed according to a process described with reference to FIG. 9A.

Figure 9B:
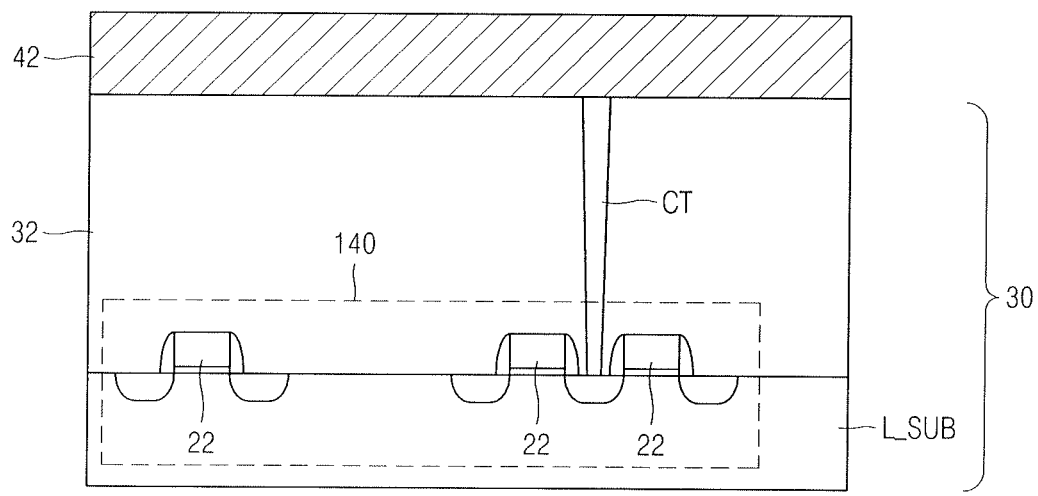

Referring to FIG. 9B, the metal layer 42 may be formed on the second semiconductor layer 30. The metal layer 42 may be connected to the contact plug CT. For example, a bottom surface of the metal layer 42 may contact a top surface of the contact plug CT that is exposed through the lower insulating layer 32.

The metal layer 42 may include a conductive material. The metal layer 42 may include, e.g., W or a W compound. The metal layer 42 may be formed by using chemical vapor deposition (CVD), atomic layer deposition (ALD), or physical vapor deposition (PVD).

Figure 9C:
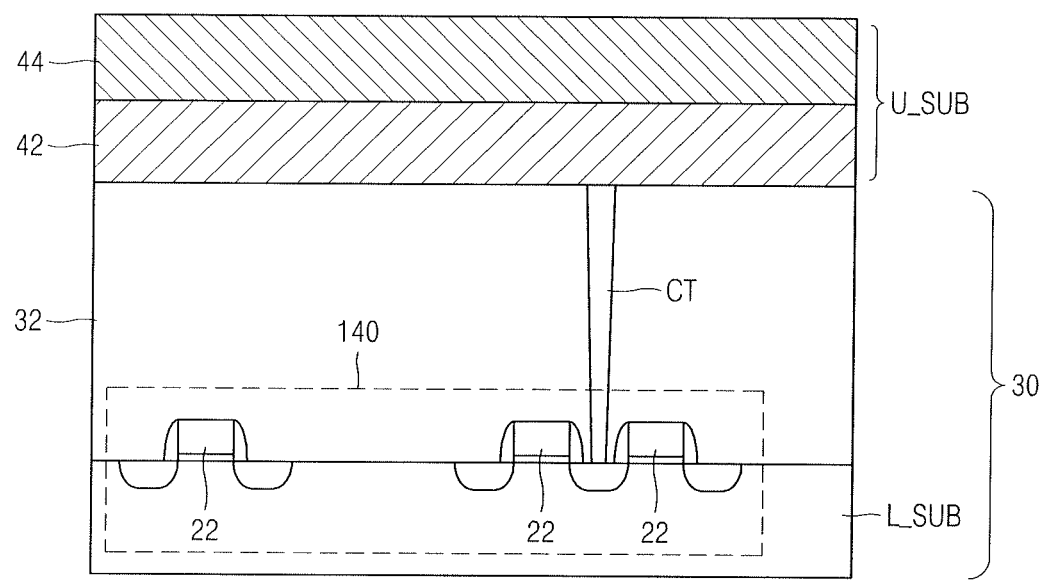

Referring to FIG. 9C, the doping layer 44 may be formed on the metal layer 42. For example, the doping layer 44 may be a polysilicon film doped with an impurity of a first conductivity type (e.g., an n-type). The doping layer 44 may be formed of, e.g., polysilicon doped with an impurity of the first conductivity type (e.g., the n-type), by using CVD, ALD, or PVD. When the doping layer 44 is formed, the impurity of the first conductivity type may be doped in situ. In an implementation, after the doping layer 44 is formed, the impurity of the first conductivity type may be doped by using ion implantation. The upper substrate U_SUB may be formed according to a process described with reference to FIGS. 9B and 9C.

Figure 9D:
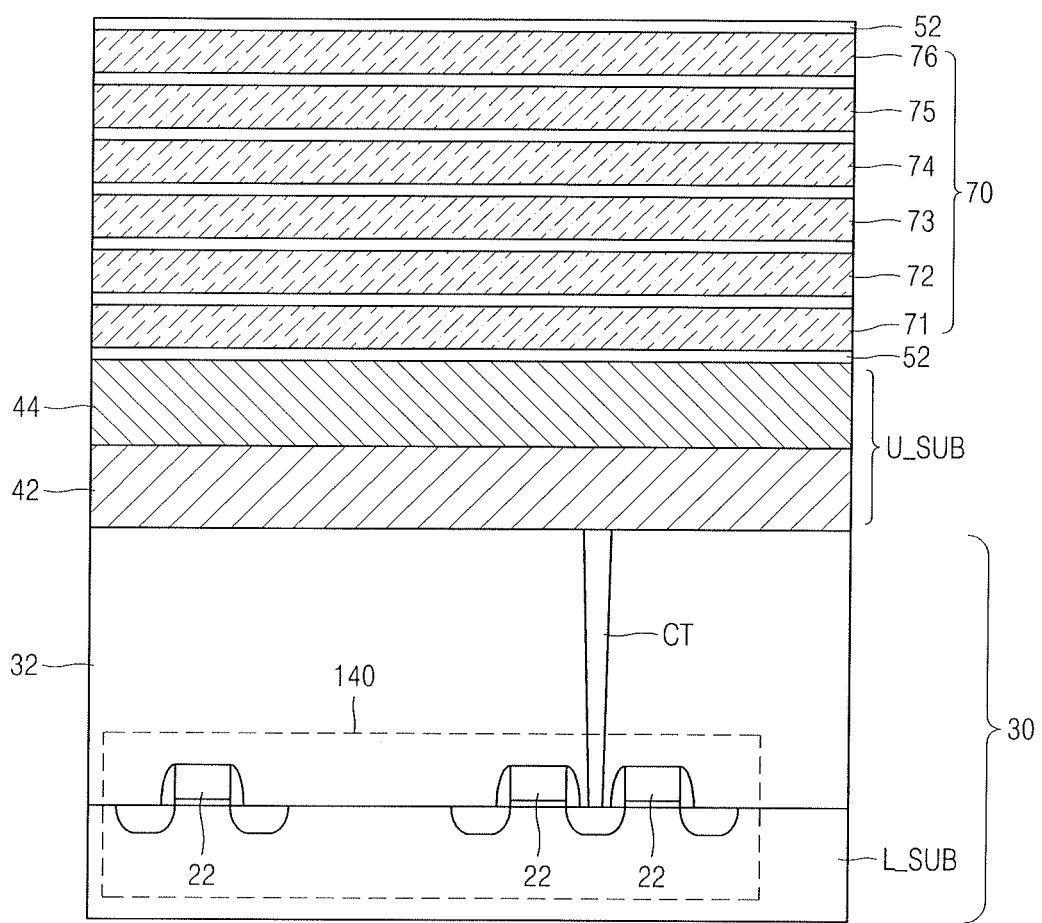

Referring to FIG. 9D, a preliminary gate stacked structure 70 may be formed by alternately stacking the insulating layers 52 and first through sixth preliminary gate layers 71 through 76 on the upper substrate U_SUB. For example, each of the insulating layers 52 may be formed to a predetermined height by using silicon oxide, silicon nitride, or silicon oxynitride.

Also, each of the first through sixth preliminary gate layers 71 through 76 may be formed to a predetermined height by using silicon oxide, silicon nitride, or polysilicon. For example, the first through sixth preliminary gate layers 71 through 76 may be preliminary films or sacrificial layers for forming the ground selection line GSL (see FIG. 4A), the plurality of word lines, e.g., the first through fourth word lines WL1 through WL4 (see FIG. 4A), and the string selection line SSL (see FIG. 4A) in a subsequent process. For example, the first through sixth preliminary gate layers 71 through 76 may be replaced with the gate conductive layers GS (see FIG. 4A) in a subsequent process. The number of preliminary gate layers may be appropriately selected according to the number of ground selection lines, word lines, and string selection lines.

In an implementation, the first through sixth preliminary gate layers 71 through 76 may not be replaced with the gate conductive layers GS (see FIG. 4A), and may be used as the ground selection line GSL (see FIG. 4A), the plurality of word lines, e.g., the first through fourth word lines WL1 through WL4 (see FIG. 4A), and the string selection line SSL (see FIG. 4A). When the first through sixth preliminary gate layers 71 through 76 are used as the gate conductive layers GS (see FIG. 4A) without being replaced, a process of forming the isolation insulating region IA (see FIG. 4A) may also be omitted.

Figure 9E:
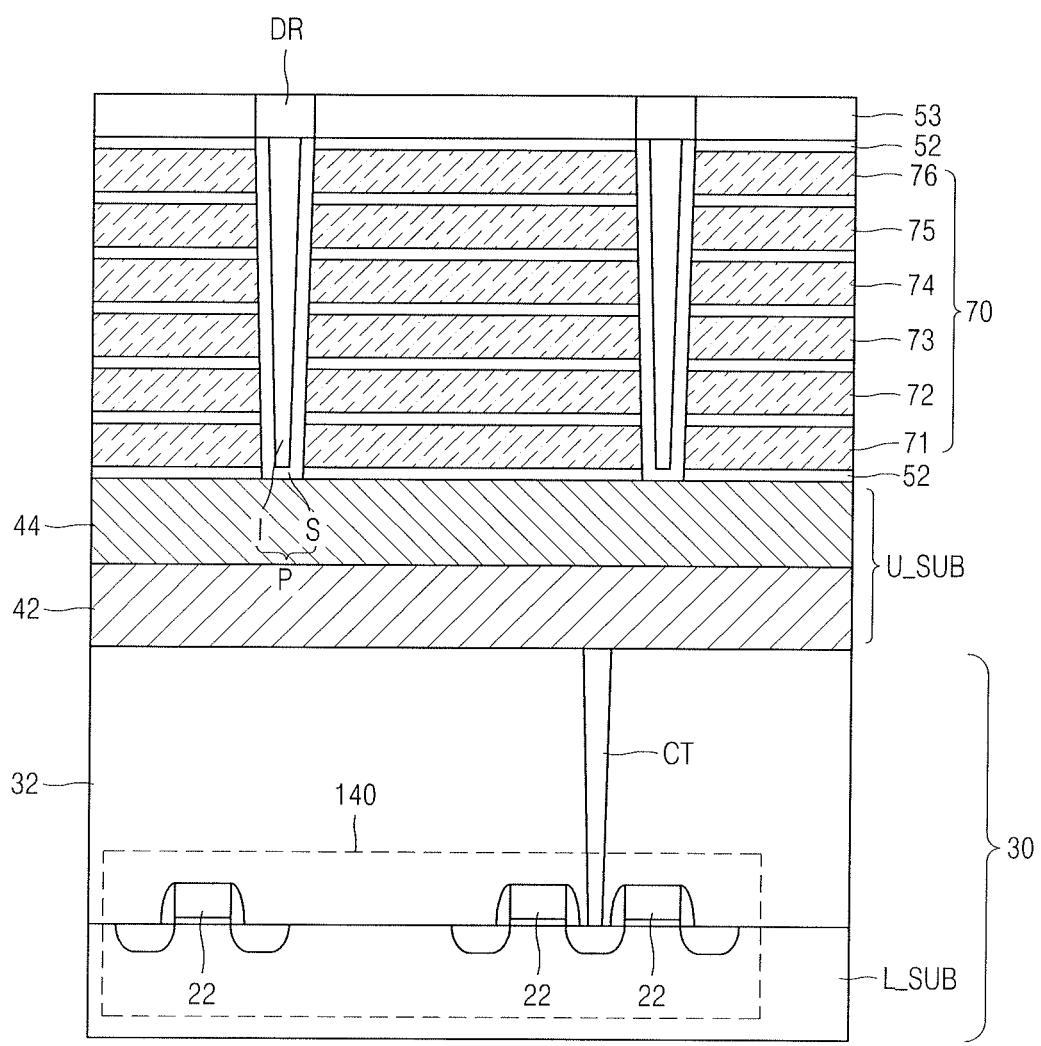

Referring to FIG. 9E, the pillars P that pass through the preliminary gate stacked structure 70 and extend in a direction perpendicular to a main surface of the upper substrate U_SUB may be formed. Each of the pillars P may include the surface layer S that functions as a channel region and the inside I including an insulating material.

For example, the surface layer S may be formed of polysilicon doped with an impurity or polysilicon not doped with an impurity in a channel hole that passes through the preliminary gate stacked structure 70, by using CVD, ALD, or PVD. The inside I may be formed of an insulating material such as silicon oxide, silicon nitride, or silicon oxynitride, in the channel hole in which the surface layer S is formed, by using CVD, ALD, or PVD.

Next, the etch-stop film 53 that covers top surfaces of the surface layer S and the inside I may be formed on the preliminary gate stacked structure 70. The etch-stop film 53 may be formed of silicon nitride, silicon oxide, or silicon oxynitride.

After a drain hole through which the top surfaces of the surface layer S and the inside I are exposed are formed in the etch-stop film 53, a temporary conductive layer that is filled in the drain hole may be formed, and the drain region DR may be formed by planarizing a top surface of the temporary conductive layer. For example, a top surface of the drain region DR may be formed at the same level as that of a top surface of the etch-stop film 53.

Figure 9F:
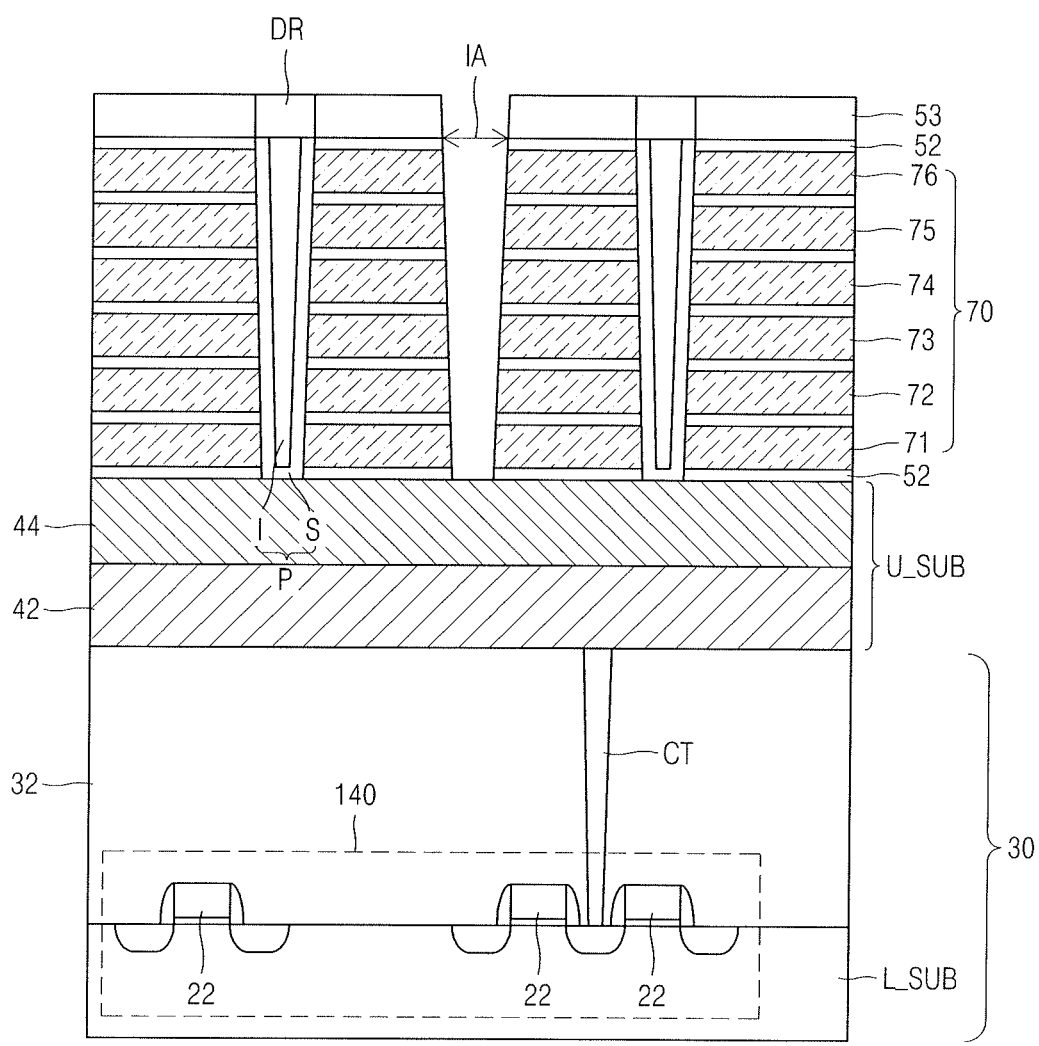

Referring to FIG. 9F, the isolation insulating region IA that passes through the plurality of insulating layers 52 and the preliminary gate stacked structure 70 and exposes the upper substrate U_SUB may be formed. In a subsequent process, the isolation insulating region IA may be a path for replacing the first through sixth preliminary gate layers 71 through 76 with the gate conductive layers GS (see FIG. 4A).

Figure 9G:
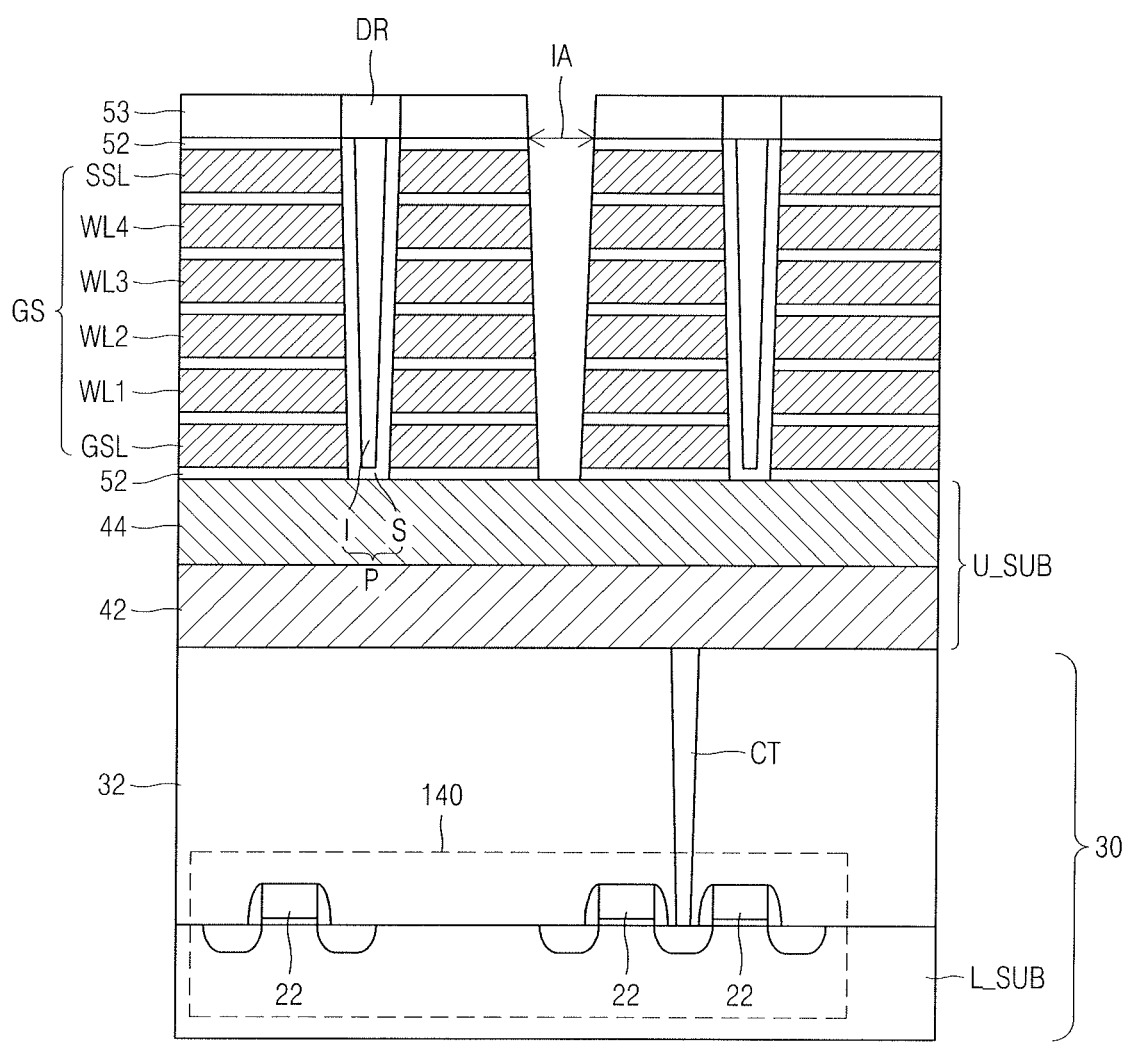

Referring to FIG. 9G, the first through sixth preliminary gate layers 71 through 76 may be replaced with the plurality of gate conductive layers GS, e.g., the ground selection line GSL, the first through fourth word lines WL1 through WL4, and the string selection line SSL through the isolation insulating region IA. In some embodiments for replacing the first through sixth preliminary gate layers 71 through 76 with the ground selection line GSL, the first through fourth word lines WL1 through WL4, and the string selection line SSL, when each of the first through sixth preliminary gate layers 71 through 76 is formed of polysilicon, a silicidation process may be performed on the first through sixth preliminary gate layers 71 through 76. In this case, each of the ground selection line GSL, the first through fourth word lines WL1 through WL4, and the string selection line SSL may be formed of, e.g., tungsten silicide, tantalum silicide, cobalt silicide, or nickel silicide.

In an implementation, after the first through sixth preliminary gate layers 71 through 76 exposed through the isolation insulating region IA are selectively removed, the ground selection line GSL, the first through fourth word lines WL1 through WL4, and the string selection line SSL may be formed by filling a conductive material in an empty space formed between the insulating layers 52. In this case, the ground selection line GSL, the first through fourth word lines WL1 through WL4, and the string selection line SSL may be formed by using a metal material such as tungsten, tantalum, cobalt, or nickel.

Figure 9H:
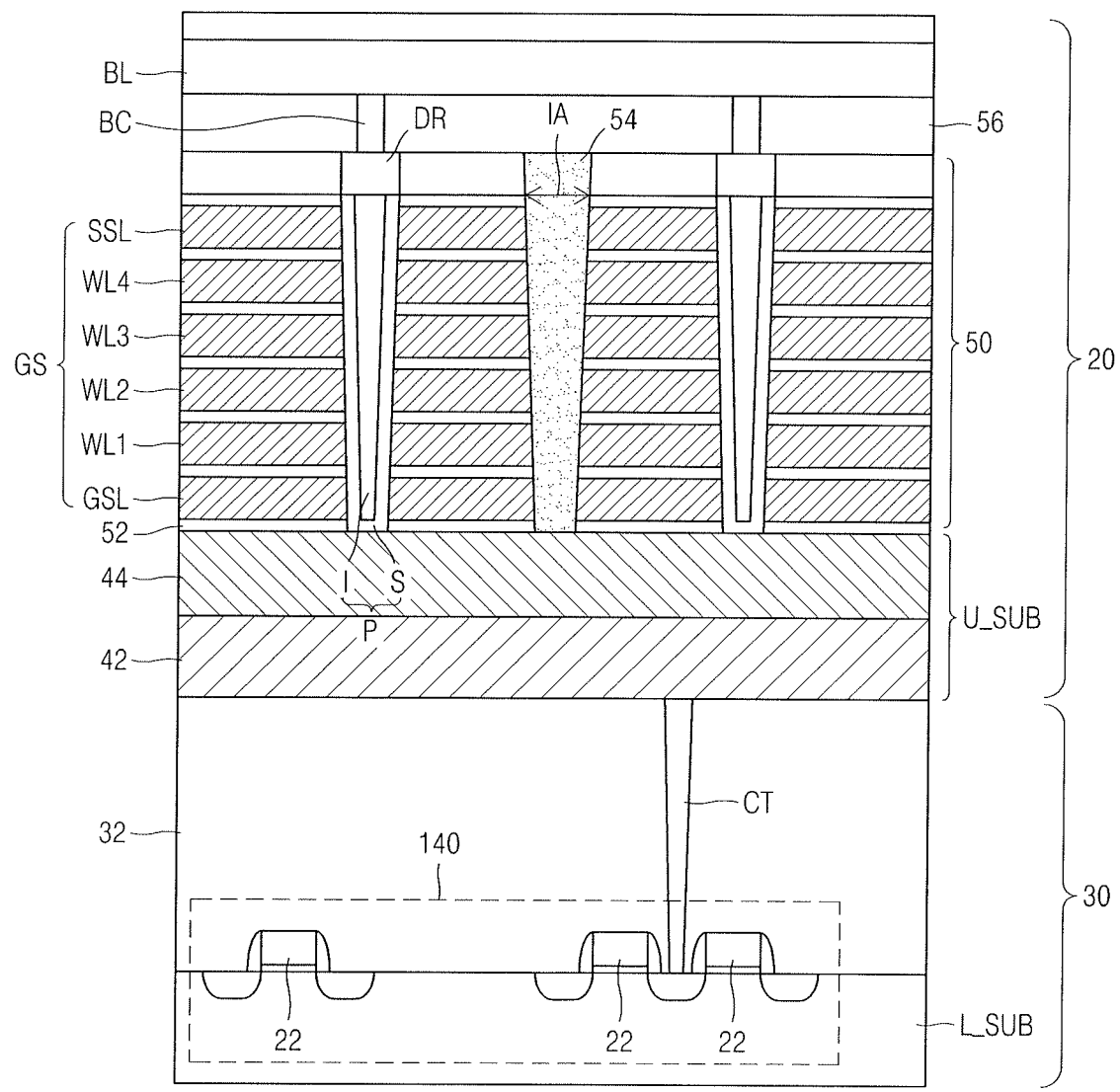
Figure 9H:
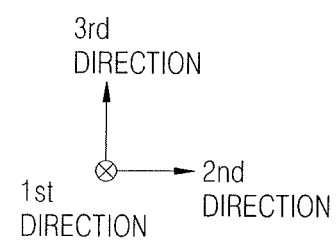

Referring to FIG. 9H, the insulating material 54 may be filled in the isolation insulating region IA. For example, the insulating material 54 may include silicon oxide, silicon nitride, or silicon oxynitride. In an implementation, the entire isolation insulating region IA may be filled with the insulating material 54. In an implementation, only a part of the isolation insulating region IA may be filled with the insulating material 54.

According to embodiments, an insulating material, instead of a common source plug, may be filled in the isolation insulating region IA, and various defects caused by the common source plug formed in the isolation insulating region IA may be avoided. Also, a width of the isolation insulating region IA may be reduced, a size of the memory cell array 50 may be reduced, and thus a chip size may be reduced.

Next, the ground selection line GSL, the first through fourth word lines WL1 through WL4, and the string selection line SSL may be patterned by using a plurality of patterning processes using a mask. The insulating layers 52 may be patterned to be aligned with adjacent gate conductive layers GS. Accordingly, the memory cell array 50 may be formed.

Next, a bit line contact BC that extends in a third direction from the drain region DR may be formed, and the bit line BL that is electrically connected to the bit line contact BC may be formed. In an embodiment, since a common source plug is not formed in the isolation insulating region IA, a common source line may not be located on the memory cell array 50. Accordingly, a degree of freedom of wiring over the memory cell array 50 may be increased.

Also, the upper insulating layer 56 that covers the bit line BL, the bit line contact BC, the memory cell array 50, and the upper substrate U_SUB may be formed. The first semiconductor layer 20 may be formed according to a process described with reference to FIGS. 9B through 9H.

Figure 10:
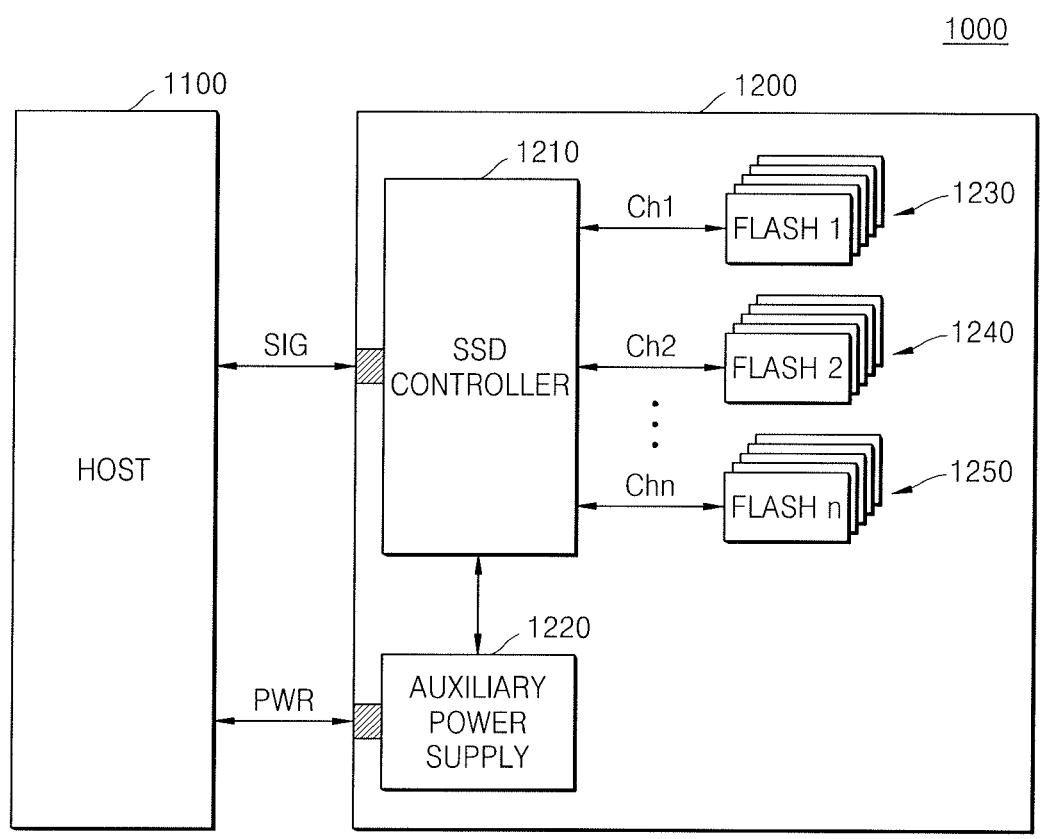
FIG. 10 illustrates a block diagram of a solid-state drive (SSD) system including a memory device according to embodiments.

FIG. 10 illustrates a block diagram of a solid-state drive (SSD) system 1000 including a memory device according to an embodiment.

Referring to FIG. 10, the SSD system 1000 may include a host 1100 and an SSD 1200. The SSD 1200 may transmit/receive a signal to/from the host 1100 through a signal connector, and may receive power through a power connector.

The SSD 1200 may include an SSD controller 1210, an auxiliary power supply 1220, and a plurality of memory devices 1230, 1240, and 1250. The plurality of memory devices 1230, 1240, and 1250 may each be a vertical stacked NAND flash memory device, and may be implemented as described with reference to FIGS. 1 through 9H. Accordingly, in each of the memory devices 1230, 1240, and 1250, a chip size may be reduced and various quality defects may be avoided.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, memory devices having a high degree of integration and excellent electrical characteristics may be desirable.

The embodiments may provide a nonvolatile memory device including a cell-on-peri or cell-over-peri (COP) structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device, comprising:
    a first semiconductor layer, the first semiconductor layer including:
        an upper substrate, and
        a memory cell array, the memory cell array including a plurality of gate conductive layers stacked on the upper substrate and a plurality of pillars passing through the plurality of gate conductive layers and extending in a direction perpendicular to a top surface of the upper substrate; and
    a second semiconductor layer under the first semiconductor layer, the second semiconductor layer including:
        a lower substrate,
        at least one contact plug between the lower substrate and the upper substrate, and
        a common source line driver on the lower substrate and configured to output a common source voltage for the plurality of pillars through the at least one contact plug,
    wherein:
        the memory cell array further includes an isolation insulating region vertically passing through the plurality of gate conductive layers,
        at least a portion of the isolation insulating region is gap-filled with at least one insulating material.

2. The nonvolatile memory device as claimed in claim 1, wherein:
    the at least one contact plug electrically connecting the lower substrate and the upper substrate, and
    the common source line driver is configured to output the common source voltage to the upper substrate through the at least one contact plug.

3. The nonvolatile memory device as claimed in claim 1, wherein each of the plurality of gate conductive layers includes polysilicon.

4. The nonvolatile memory device as claimed in claim 1, wherein:
    the second semiconductor layer further includes a conductive layer located between the upper substrate and the lower substrate;
    the at least one contact plug includes at least one lower contact plug between the conductive layer and the lower substrate, the at least one lower contact plug electrically connecting the common source line driver and the conductive layer; and
    the at least one contact plug includes at least one upper contact plug between the upper substrate and the conductive layer, the at least one upper contact plug electrically connecting the upper substrate and the conductive layer.

5. The nonvolatile memory device as claimed in claim 2, wherein the upper substrate includes a metal layer connected to the at least one contact plug.

6. The nonvolatile memory device as claimed in claim 5, wherein the upper substrate further includes a doping layer stacked on the metal layer, the doping layer being doped with an impurity of a first conductivity type.

7. The nonvolatile memory device as claimed in claim 4, wherein a number of the at least one lower contact plug in the second semiconductor layer is greater than a number of the at least one upper contact plug in the second semiconductor layer.

8. The nonvolatile memory device as claimed in claim 4, wherein a number of the at least one lower contact plug in the second semiconductor layer is less than a number of the at least one upper contact plug in the second semiconductor layer.

9. A method of manufacturing a nonvolatile memory device, the method comprising:
    forming one or more peripheral transistors on a portion of a lower substrate;
    forming a lower insulating layer covering the one or more peripheral transistors;
    forming one or more contact plugs passing through the lower insulating layer and vertically extending from the one or more peripheral transistors;
    forming, on the lower insulating layer, an upper substrate that includes a metal layer electrically connected to the one or more contact plugs; and forming a memory cell array that includes a plurality of gate conductive layers stacked on the upper substrate such that the upper substrate is between the lower substrate and the memory cell array.

10. The method as claimed in claim 9, wherein forming the upper substrate includes:
stacking the metal layer on the lower insulating layer; and
forming, on the metal layer, a doping layer doped with an impurity of a first conductivity type.

11. The method as claimed in claim 9, wherein forming the memory cell array includes:
forming a preliminary gate stacked structure by alternately stacking a plurality of insulating layers and a plurality of preliminary gate layers on the upper substrate;
forming an isolation insulating region passing through the preliminary gate stacked structure and through which a portion of the upper substrate is exposed;
replacing the plurality of preliminary gate layers with the plurality of gate conductive layers; and
gap-filling the isolation insulating region with an insulating material.

12. The method as claimed in claim 9, wherein forming the one or more peripheral transistors includes forming, on a part of the lower substrate, a common source line driver that includes the one or more peripheral transistors.

13. The method as claimed in claim 9, wherein forming the memory cell array includes:
forming an isolation insulating region through which a portion of the upper substrate is exposed; and
gap-filling the isolation insulating region with an insulating material.

14. A nonvolatile memory device, comprising:
a first semiconductor layer, the first semiconductor layer including:
an upper substrate,
a plurality of pillars vertically extending from the upper substrate, and
a memory cell array that includes a plurality of gate conductive layers stacked on the upper substrate along side walls of the plurality of pillars; and
a second semiconductor layer under the first semiconductor layer, the second semiconductor layer including:
a lower substrate on which a common source line driver configured to output a common source voltage to the memory cell array is formed,
a lower insulating layer between the lower substrate and the upper substrate, and
one or more contact plugs passing through at least a portion of the lower insulating layer and electrically connecting the common source line driver and the upper substrate,
wherein one end of the one or more contact plugs directly contacts the common source line driver and another end of the one or more contact plugs directly contacts the upper substrate.

15. The nonvolatile memory device as claimed in claim 14, wherein the common source line driver is also configured to output the common source voltage to the upper substrate through the one or more contact plugs.

16. The nonvolatile memory device as claimed in claim 14, wherein:
the memory cell array further includes an isolation insulating region vertically passing through the plurality of gate conductive layers,
at least a portion of the isolation insulating region is gap-filled with at least one insulating material.

17. The nonvolatile memory device as claimed in claim 14, wherein the upper substrate includes:
a metal layer electrically connected to the one or more contact plugs; and
a doping layer stacked on the metal layer, the doping layer being doped with an impurity of a first conductivity type.

18. The nonvolatile memory device as claimed in claim 14, wherein the common source line driver vertically overlaps at least a portion of the memory cell array.

19. The nonvolatile memory device as claimed in claim 17, wherein the lower substrate is a substrate of a second conductivity type that is different from the first conductivity type.

* * * * *